(12) United States Patent
Vijverberg et al.

(10) Patent No.: US 10,144,134 B2
(45) Date of Patent: Dec. 4, 2018

(54) ENCLOSURE FOR A TARGET PROCESSING MACHINE

(71) Applicant: Mapper Lithography IP B.V., Delft (NL)

(72) Inventors: Joep Gerard Vijverberg, The Hague (NL); Laurens Vincent Plandsoen, Capelle Aan den Ijssel (NL); Bas van Gelder, The Hague (NL); Guido de Boer, Leerdam (NL); Michel Pieter Dansberg, Berkel en Rodenrijs (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 631 days.

(21) Appl. No.: 14/705,928

(22) Filed: May 6, 2015

(65) Prior Publication Data
US 2015/0321356 A1 Nov. 12, 2015

Related U.S. Application Data

(60) Provisional application No. 61/990,034, filed on May 7, 2014.

(51) Int. Cl.
*B25J 11/00* (2006.01)
*G03F 9/00* (2006.01)
(Continued)

(52) U.S. Cl.
CPC ............. *B25J 11/00* (2013.01); *G03F 7/7075* (2013.01); *G03F 7/70808* (2013.01);
(Continued)

(58) Field of Classification Search
CPC ..... G03F 7/7075; B25J 11/0095; H01J 37/16; H01L 21/67225; H01L 21/67775; H01L 21/6719
(Continued)

(56) References Cited

U.S. PATENT DOCUMENTS 4,851,018 A * 7/1989 Lazzari ................. F24F 3/161
                                                                55/356
4,948,979 A * 8/1990 Munakata ............... H01J 37/18
                                                      250/441.11

(Continued)

FOREIGN PATENT DOCUMENTS

| CN | 1261947 | 9/1995 |
|---|---|---|
| CN | 101014406 | 8/2007 |

(Continued)

OTHER PUBLICATIONS

Office Action received for Chinese Patent Application No. 201580033308.9, dated Nov. 30, 2017, 18 pages (10 pages of English Translation and 8 pages of Office Action).

(Continued)

*Primary Examiner* — Kaitlin S Joerger
(74) *Attorney, Agent, or Firm* — Womble Bond Dickinson (US) LLP

(57) ABSTRACT

The invention relates to an assembly for enclosing a target processing machine. The assembly comprises an enclosure and a transfer unit. The enclosure comprises a base plate for arranging said target processing machine thereon, side wall panels, which are fixed to said base plate, and a top wall panel which is fixed to said side wall panels. In addition, the enclosure comprises an access opening in a side wall of the enclosure. The transfer unit comprising one or more transfer elements for moving the transfer unit with respect to the base plate. The transfer unit further comprises a door panel which is arranged for closing the access opening, wherein the door panel is movably mounted to the transfer unit by means of a flexible coupling which allows a movement of the door panel with respect to the transfer unit at least in a direction towards and/or away from the enclosure.

42 Claims, 14 Drawing Sheets

(51) Int. Cl.
*G03F 7/20* (2006.01)
*H01L 21/67* (2006.01)
*H01L 21/677* (2006.01)
*H01J 37/16* (2006.01)
*H01J 37/317* (2006.01)

(52) U.S. Cl.
CPC ........ *G03F 7/70841* (2013.01); *G03F 9/7096* (2013.01); *H01J 37/16* (2013.01); *H01J 37/3177* (2013.01); *H01L 21/6719* (2013.01); *H01L 21/67225* (2013.01); *H01L 21/67775* (2013.01); *H01J 2237/024* (2013.01); *H01J 2237/166* (2013.01)

(58) Field of Classification Search
USPC ........................................................ 414/217
See application file for complete search history.

(56) References Cited

U.S. PATENT DOCUMENTS

| | | | | |
|---|---|---|---|---|
| 5,364,219 A | * | 11/1994 | Takahashi | H01L 21/67724 118/719 |
| 6,238,161 B1 | * | 5/2001 | Kirkpatrick | H01L 21/67173 414/217 |
| 6,637,998 B2 | * | 10/2003 | Langan | H01L 21/67724 414/217 |
| 6,658,762 B2 | * | 12/2003 | Chang | H01L 21/67775 34/380 |
| 6,935,201 B2 | * | 8/2005 | Abraham | H01L 21/67253 73/865.8 |
| 7,942,619 B2 | * | 5/2011 | Hashimoto | H01L 21/67766 414/217 |
| 8,097,084 B2 | * | 1/2012 | Geiser | H01L 21/67742 118/719 |
| 2001/0051082 A1 | * | 12/2001 | Kirkpatrick | H01L 21/67173 414/217 |
| 2003/0012626 A1 | | 1/2003 | Aggarwal | |
| 2006/0033061 A1 | | 2/2006 | van Mast et al. | |
| 2008/0124192 A1 | * | 5/2008 | Karasawa | H01L 21/67379 414/217 |
| 2010/0329828 A1 | * | 12/2010 | Kisimoto | H01L 21/6719 414/217 |
| 2012/0155994 A1 | * | 6/2012 | Kishimoto | C23C 16/54 414/217 |
| 2014/0363258 A1 | * | 12/2014 | Iwamoto | H01L 21/67772 414/217 |

FOREIGN PATENT DOCUMENTS

| | | |
|---|---|---|
| CN | 203318736 | 12/2013 |
| JP | 07-251743 A | 10/1995 |
| WO | WO-9854492 | 12/1998 |
| WO | WO 2012/080278 A1 | 6/2012 |
| WO | WO 2012/146789 A1 | 11/2012 |
| WO | WO 2013/037802 A1 | 3/2013 |

OTHER PUBLICATIONS

International Search Report and Written Opinion received for PCT Patent Application No. PCT/NL2015/050303, dated Oct. 26, 2015, 11 pages.
International Preliminary Report on Patentability received for PCT Patent Application No. PCT/NL2015/050303, dated Nov. 17, 2016, 9 pages.

* cited by examiner

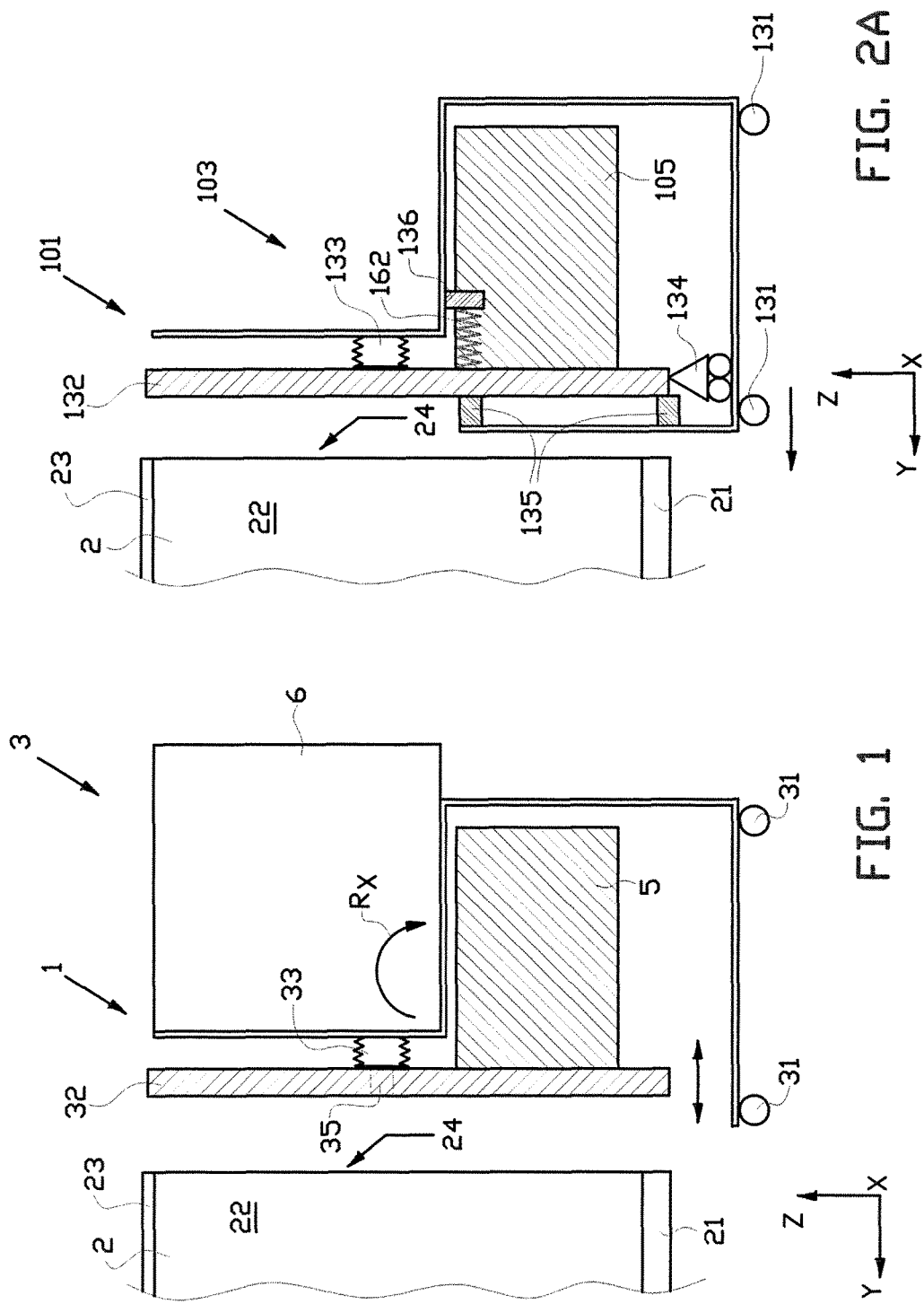

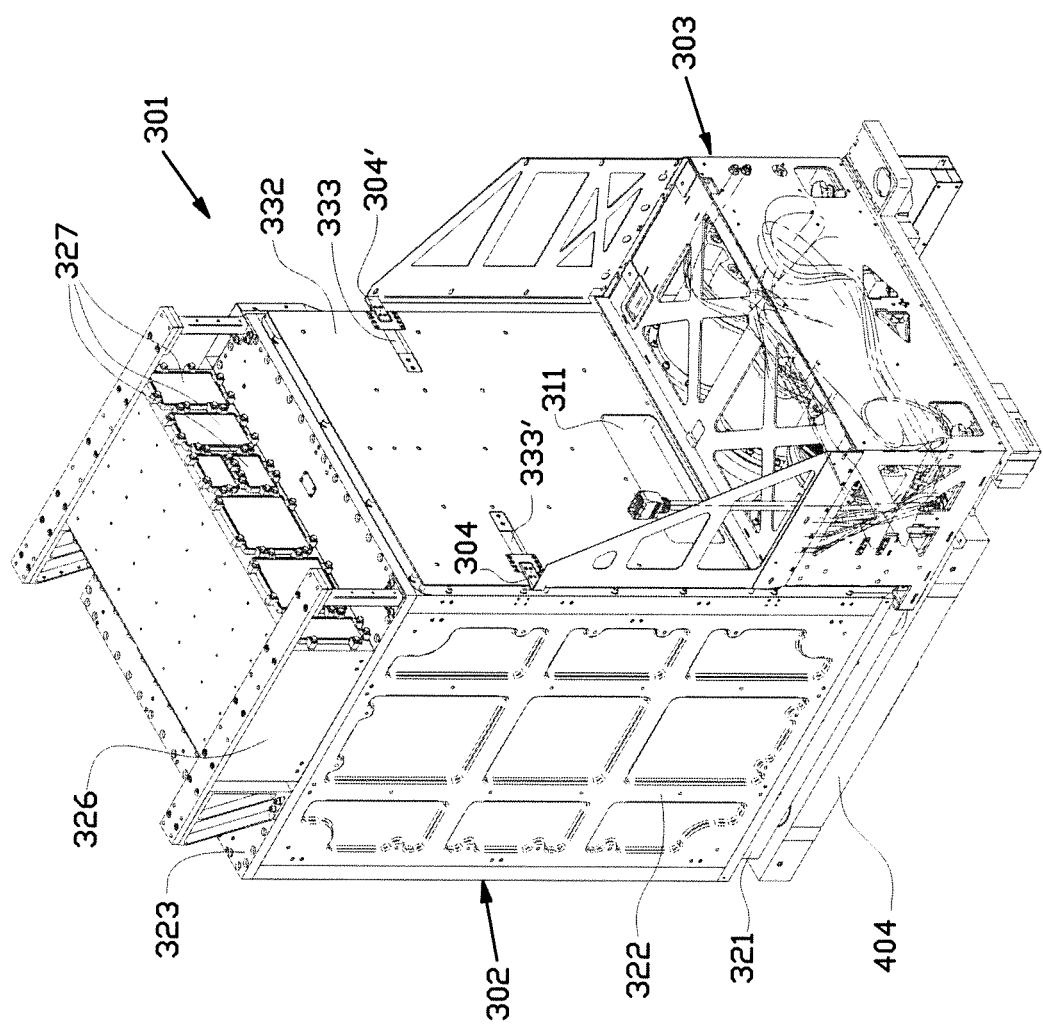

ENCLOSURE FOR A TARGET PROCESSING MACHINE

BACKGROUND

The invention relates to an enclosure for a target processing machine, such as a lithography or an inspection machine.

An example of such an enclosure is published in the International Publication WO2013/037802 which is assigned to the owner of the present invention. The target processing machine as disclosed in WO2013/037802, such as a lithography or inspection machine, comprises a rigid base plate, a projection column for projecting one or more optical or particle beams on to a target, a support frame supporting the projection column, the support frame being supported by and fixed to the base plate, a stage comprising a movable part for carrying the target and a fixed part being supported by and fixed to the base plate. This target processing machine is arranged inside an enclosure, also referred to as a vacuum chamber, encloses the support frame and the column. The enclosure is arranged for providing and maintaining a vacuum environment in the interior space of the enclosure. The enclosure comprises the base plate, forming part of the enclosure, and a plurality of wall panels supported by and fixed to said base plate. The enclosure comprises a door frame for one of the side walls, and a door being substantially the size of as a wall panel and fitting into the door frame.

The International Publication WO2012/080278 which is assigned to the owner of the present invention, discloses a lithography system unit comprising a lithography apparatus that is contained in its own vacuum chamber. A side of the lithography system facing a free area provided for service purposes comprises a load lock system for transferring substrates into and out of the vacuum chamber, and also comprises an access door that can be opened for such service purposes. The lithography system units are thus provided with a door at the same side as the load lock system. The door is removable attachable, and is removable in its entirety, for example using a transfer unit. The transfer unit is arranged to support the door and comprises one or more transfer elements, such as wheels or rails. The lithography apparatus is supported by a supporting structure for positioning the lithography apparatus at an elevated position. The load lock system is integrated into the door.

The U.S. Pat. No. 4,948,979 discloses a vacuum device comprising a vacuum working chamber for performing a predetermined process to a material such as a substrate, and a vacuum prechamber for changing the material. Both the vacuum chambers are coupled by a coupling member so as to communicate the interiors of the respective chambers and the communication is managed by valve means located for the coupling member. The vacuum chambers may be constructed so as to be movable or pivotable horizontally with respect to each other. According to the construction of this vacuum device, a vacuum leaking operation, a vacuuming operation, and the material exchanging operation is performed in the state with both vacuum chambers being separated to eliminate the transferring of the vibration of one of the vacuum chamber, to precisely carry out the various processes without being influenced thereby. Accordingly, during each material exchanging operation the vacuum chambers need to be separated and coupled to each other, thus requiring much time and labour. In addition, when coupling the vacuum chambers, the front surfaces of the coupling members have to be contacted to each other when the coupling members are to be connected. Although not described in detail in the U.S. Pat. No. 4,948,979, when the coupling members are connected, they need to provide a vacuum tight coupling. How this vacuum tight coupling is obtained is not described in the U.S. Pat. No. 4,948,979.

To obtain a vacuum tight coupling between the chamber, an accurate and careful alignment of the vacuum chambers with respect to each other is required. In particular an accurate and careful alignment of the vacuum prechamber with respect to the vacuum working chamber during the coupling of the vacuum chambers is required, in order to arranged the front surfaces of the coupling members in a vacuum tight contracting manner and to ensure maintenance of the vacuum condition inside the chambers.

It is an object of the present invention to provide a novel and improved enclosure for a target processing machine, which in particular allows a more accurate alignment between the target processing machine and a transfer device, such as a load lock system for transferring targets into and out of the target processing machine inside the enclosure.

SUMMARY OF THE INVENTION

According to a first aspect, the present invention provides an assembly for enclosing a target processing machine, wherein the assembly comprises an enclosure and a transfer unit, wherein the enclosure comprising:

a base plate for arranging said target processing machine thereon, side wall panels, which are fixed to said base plate, and a top wall panel which is fixed to said side wall panels, wherein the enclosure comprises an access opening in a side wall of the enclosure, wherein the transfer unit comprising one or more transfer elements for moving and/or positioning the transfer unit with respect to the base plate, wherein the transfer unit comprises a door panel which is arranged for closing the access opening, the door panel is mounted to the transfer unit by means of an flexible coupling, wherein the flexible coupling is arranged to allow a movement of the door panel with respect to the transfer unit at least in a direction towards and/or away from the enclosure at least when the transfer unit is arranged in front of the access opening of the enclosure.

By arranging the door panel movably on the transfer unit, mounting tolerances and/or mounting inaccuracies or deviations of the door panel when arranged at the access opening, in particular for closing the access opening, are at least substantially absorbed by a movement of the door panel with respect to the transfer unit. According to the invention the transfer unit can be accurately positioned with respect to the base plate, substantially independent from mounting tolerances and/or mounting inaccuracies or deviations of the door panel when arranged at the access opening. This allows a more accurate alignment between the target processing machine on the base plate and the transfer unit, which for example is provided with transfer device, such as a load lock system for transferring targets into and out of the target processing machine inside the enclosure.

In addition, deformations of the enclosure and/or the door panel during the evacuating of the space inside the enclosure and/or during maintaining a vacuum condition inside the enclosure are also at least substantially absorbed by a movement of the door panel with respect to the transfer unit. Thus such deformations at least substantially do not disturb the accurate alignment between the target processing machine on the base plate and a transfer device arranged on the transfer unit.

According to the invention, the door panel is mounted to the transfer unit by means of a flexible coupling. By arranging the door panel on the transfer unit via a flexible coupling, mounting tolerances and/or mounting inaccuracies or deviations of the door panel when arranged at the access opening, in particular for closing the access opening, are at least substantially absorbed by said flexible coupling.

According to the invention, the flexible coupling is arranged to allow a movement of the door panel with respect to the transfer unit, preferably at least in a direction towards and/or away from the enclosure, in particular when the transfer unit is arranged in front of the access opening of the enclosure. The flexibility in the direction towards and/or away from the enclosure is particularly advantageous for absorbing any movements and/or deviations of the door panel during closing of the access opening and/or during the evacuating of the space inside the enclosure and/or during maintaining a vacuum condition inside the enclosure.

Due to the flexible coupling according to the invention, the alignment of the transfer unit with respect to the enclosure does not have to be as accurate and careful as the alignment of the vacuum chambers according to the U.S. Pat. No. 4,948,979.

In an embodiment, the flexible coupling comprises an elastic connection between the door panel and the transfer unit. In an embodiment the flexible coupling comprises a spring mount. Such a spring mount provides on the one hand the desired movability between the door panel and the transfer unit. On the other hand, the spring mount can provide a preload force to urge the door panel into a desired position with respect to the transfer unit, for example in order to assist in aligning the door panel with respect to the enclosure and/or to assist in providing a preload to a pre-vacuum seal as discussed in more detail below.

In an embodiment the door panel is mounted to the transfer unit by means of one or more leaf springs. The use of leaf springs is particular advantageous because they can provide the required flexible coupling in a direction substantially perpendicular to a longitudinal direction of the leaf springs and in addition they provide a substantial fixed position between the door panel and the transfer unit in a direction substantially parallel to the longitudinal direction of the leaf springs. In an embodiment, the door panel is suspended on said transfer unit by means of said one or more leaf springs.

In an embodiment, the door panel is arranged to abut against the enclosure for closing the access opening. When the transfer unit is moved towards the enclosure, the door panel abuts against the enclosure, preferably against a pre-vacuum seal or a vacuum seal of the enclosure, which is arranged around the access opening.

When the door panel is arranged against the enclosure and closing the access opening, the door panel is preferably provided as a side wall or a side wall part of the enclosure. In an embodiment, the door panel comprises a first surface which demarcate or borders the inside area of the enclosure, and preferably comprises a second surface, opposite to the first surface, which at least partially demarcate or borders the ambient area surrounding the outside of the enclosure. In an embodiment, the access opening and the door panel has a size of substantially an entire side wall of the enclosure, in order to allow easy access to the inside area of the enclosure for maintenance or service operations, for example.

In an embodiment, the transfer unit with the door panel is detachable from the enclosure, preferably wherein the transfer unit with the door panel is removable from the enclosure in its entirety. Accordingly, the transfer unit can quickly be replace by another transfer unit if required, which reduces the down-time of the target processing machine, for example during maintenance.

In an embodiment, the assembly comprises a positioning member and a complementary positioning member, wherein the positioning member is fixedly connected to the base plate and the complementary positioning member is fixedly connected to the transfer unit, wherein the positioning member and the complementary position member are arranged to align the base plate and the transfer unit with respect to each other, at least when the positioning member and the complementary positioning member are joined together. The positioning member and complementary positioning member assist in the accurate alignment of the transfer unit with respect to the base plate.

In an embodiment, the positioning member and the complementary positioning member each comprises one of a first alignment member and a first complementary alignment member to provide a fixed distance between the base plate and the transfer unit, at least when the first alignment member and the first complementary alignment member are joined together. In an embodiment, the first alignment member comprises a socket and wherein the first complementary alignment member comprises a spigot, wherein the spigot is insertable in the socket to provide the fixed distance between the base plate and the transfer unit. In an embodiment the spigot is insertable in the socket to provide a fixed position of the transfer unit with respect to the base plate.

In an embodiment, the positioning member and the complementary positioning member each comprises one of a second alignment member and a second complementary alignment member to provide a fixed rotational orientation between the base plate and the transfer unit, in particular a fixed rotational orientation around an axis which extends substantially perpendicular to the base plate, at least when the second alignment member and the second complementary alignment member are joined together. In an embodiment, the second alignment member comprises a contact surface and the second complementary alignment member comprises an abutment member, wherein the abutment member is arrangeable to abut against the contact surface to provide the fixed rotational orientation between the base plate and the transfer unit.

In an embodiment, the base plate comprises a preload member and the transfer unit comprises a complementary preload member, wherein the preload member and the complementary preload member are arranged to be coupled to each other and to provide a mechanical preload of the transfer unit with the door panel towards the enclosure. In an embodiment, the preload member and the complementary preload member comprises one of an aperture and a hook, wherein the hook is arranged to move into the aperture for coupling the preload member and the complementary preload member to each other. In an embodiment, the hook is coupled to an actuator for providing a preload force for assisting in positioning the transfer unit at a fixed and/or rigid position with respect to the base plate. In addition, the preload force pushes the door panel towards the enclosure and assists in the closing of the access opening as described in more detail below.

In an embodiment, the assembly further comprises a pre-vacuum seal and a vacuum seal, which are both arranged around the access opening in the side wall of the enclosure at least when the door panel is arranged in front of the access opening of the enclosure. In particular the pre-load pushes the door panel against the pre-vacuum seal. With the door panel against the pre-vacuum seal, the space inside the enclosure can be evacuated using a pre-vacuum pump. Due to the reduced pressure inside the enclosure with respect to the ambient air pressure outside the enclosure, the door panel is pushed by the ambient air pressure further towards the enclosure, in particular against the vacuum seal. When the door panel is pushed against the vacuum seal, the space inside the enclosure can be evacuated further in order to obtain and/or maintain a vacuum condition inside the enclosure.

Note that the term 'vacuum' as used herein, does not refer to a perfect vacuum, but to an internal pressure inside the enclosure that is lower than the pressure in the environment surrounding the enclosure. For example, for a charged particle lithography machine in the enclosure, the vacuum pressure inside the enclosure is preferably $10^{-3}$ mbar or lower, more preferably $10^{-6}$ mbar or lower.

In an embodiment, the vacuum seal is arranged between the pre-vacuum seal and the access opening. Thus, the vacuum seal is arranged within the pre-vacuum seal, at least as viewed in the plane of the opening in the side wall of the enclosure. In use, the vacuum seal is arranged adjacent to the evacuated space within the enclosure, whereas the pre-vacuum seal is arranged adjacent to the ambient atmosphere surrounding the outside of the enclosure.

In an embodiment, the pre-vacuum seal comprises a flexible flap which extends in a direction between the door panel and the enclosure over a distance which is larger than the thickness of the vacuum seal in this direction, at least when the door panel is arranged in front of the access opening of the enclosure. The flexible flap extends over a large distance, for example 5 mm or more past the vacuum seal, preferably 10 to 20 mm past the vacuum seal, in order to assist in sealing the enclosure when the door panel is close to the enclosure, but not yet abutting said enclosure and/or the vacuum seal of said enclosure.

Although, the pre-vacuum seal can be arranged on the door panel, it is preferred that the pre-vacuum seal is arranged in the side wall of the enclosure, preferably in a first recess in the side wall of the enclosure. Although, the vacuum seal can be arranged on the door panel, it is preferred that the vacuum seal is arranged in the side wall of the enclosure, preferably in a second recess in the side wall of the enclosure.

In an embodiment, the assembly comprises a pedestal, and wherein the pedestal is provided with a transfer unit location for arranging the transfer unit thereon. In an embodiment, the base plate is arranged at a fixed and/or rigid position on said pedestal, It is noted that within the context of the present application the term 'fixed' refers to a condition which at least substantially restrains all three degrees of freedom of translation (X, Y and Z), and the term 'rigid' refers to a condition which at least substantially restrains all three degrees of freedom of rotation (Rx, Ry and Rz).

In an embodiment, the transfer unit comprises support members and the transfer unit location of the pedestal comprises support member contact surfaces, wherein each of said support member contact surfaces is arranged to receive one of the support members, wherein the support members and support member contact surfaces are arranged to provide a fixed distance between the transfer unit and the pedestal and/or to provide a fixed rotational orientation around an axis which extends substantially parallel to the pedestal and/or base plate. Since the base plate is preferably arranged at a fixed and/or rigid position on said pedestal and the support members and the support member contact surfaces provide an at least partially fixed and/or rigid position of the transfer unit with respect to the pedestal, the pedestal provides an additional alignment means for an accurate alignment between the target processing machine and a transfer device on said transfer unit. In particular in combination with the first alignment member and first complementary alignment, and the second alignment member and second complementary alignment member, an exact and definite position of the transfer unit and the base plate is established wherein all six degrees of freedom are controlled or restrained.

In an embodiment, the pedestal is provided with an interface unit arranged at the transfer unit location, wherein the interface unit is connectable to the transfer unit at least when the transfer unit is arranged substantially at the transfer unit location on the pedestal.

In an embodiment, the interface unit is arranged to provide a connection between the transfer unit and technical service connections for providing facilities to the transfer unit, wherein the facilities comprises one or more of a power supply, a water supply and/or drain, a vacuum duct and an air supply. The interface unit provides facilities, such as the power supply, to the transfer unit and/or to a transfer device arranged on said transfer unit, and/or the interface unit provides facilities, such as the power supply and the vacuum duct, to the door panel, preferably via a flexible cable and conduit to preserve the movability of the door panel and the transfer unit.

In an embodiment, the interface unit comprising an actuator for moving the interface unit or a coupling unit of the interface unit, towards the transfer unit to provide said connection. In an embodiment, the actuator is arranged for moving the interface unit or said coupling unit is a substantially vertical direction. Thus the interface unit, which is arranged in or near a floor, is actuated to move upwards, out of the floor, to connect to a bottom side of the transfer unit. When the transfer unit is moved away from the enclosure, the interface unit is retracted by the actuator and thus provides easy access to the enclosure, substantially without the interface unit forming an obstacle.

In an embodiment, the transfer elements comprises one or more air pads which are connectable to a compressed air supply. In an embodiment the one or more air pads are arranged at a bottom side of the transfer unit, and are preferably arranged for hovering the transfer unit substantially above a floor, such as a substantially closed floor near the enclosure. In an embodiment, the one or more air pads are arranged at the bottom side of the transfer unit to provide a substantially balanced and/or stable hovering of the transfer unit above the floor. When the transfer unit needs to be moved, a compressed air supply is connected to the one or more air pads which allow the transfer unit to hover above the floor surface, in particular a closed floor surface near the enclosure, and can easily be moved in all directions over said floor surface by an operator.

In an embodiment, the door panel is provided with a transit opening and wherein the assembly further comprises a transfer device which is arranged at a fixed and/or rigid position on said transfer unit, substantially adjacent to the transit opening. In an embodiment, the transfer device comprises a load lock system which is connected to the door panel via a flexible coupling, preferably via a vacuum bellow, which surrounds the transit opening.

In an embodiment, the door panel is provided with one or more vacuum pumps, in particular one or more turbomolecular pumps. In an embodiment the one or more vacuum pumps are connected to the transfer unit via a flexible conduit, preferably via a vacuum bellow, in order to at least substantially preserve the movability between the door panel and the transfer unit.

In an embodiment the flexible conduit is connectable to the interface unit, in particular to provide a connection between the one or more vacuum pumps and a vacuum duct in the transfer unit, which vacuum duct preferably is connected to a pre-vacuum pump. The one or more turbomolecular pumps are connectable to the interface unit for providing a fluid connection to one or more pre-vacuum pumps arranged at a distance from the enclosure and the transfer unit.

According to a second aspect, the present invention provides a transfer unit suitable and intended for use in an assembly as described above.

According to a further aspect, the present invention provides a transfer unit for an assembly for enclosing a target processing machine, wherein the assembly comprises an enclosure, a door panel and a transfer unit, wherein the enclosure comprises an access opening in a side wall of the enclosure, and wherein the door panel is arranged for closing the access opening, and wherein the transfer unit comprising one or more transfer elements for moving the transfer unit with respect to the enclosure, in particular for positioning the transfer unit adjacent to the enclosure and/or the door panel, wherein the transfer elements comprises one or more air pads which are connectable to a compressed air supply.

In an embodiment, the one or more air pads are arranged at a bottom side of the transfer unit, and are preferably arranged for hovering the transfer unit substantially above a floor, in particular a substantially closed floor near the enclosure.

In an embodiment, the one or more air pads are arranged at the bottom side of the transfer unit to provide a substantially balanced and/or stable hovering of the transfer unit above the floor.

According to a further aspect, the present invention provides an assembly for enclosing a target processing machine, wherein the assembly comprises an enclosure, a door, a transfer unit, and a floor section for at least supporting said transfer unit, wherein the enclosure comprises an access opening in a side wall of the enclosure, and wherein the door panel which is arranged for closing the access opening, wherein the transfer unit comprising one or more transfer elements for moving the transfer unit with respect to the enclosure, and wherein the floor section is arranged adjacent to the enclosure and/or the door panel, and is provided with a transfer unit location for positioning the transfer unit thereon.

In an embodiment, the enclosure is arranged at a fixed and/or rigid position on said floor section.

In an embodiment, the transfer unit comprises support members and the transfer unit location of the floor section comprises support member contact surfaces, wherein each of said support member contact surfaces is arranged to receive one of the support members, wherein the support members and support member contact surfaces are arranged to provide a fixed distance between the transfer unit and the floor section and/or to provide a fixed rotational orientation around an axis which extends substantially parallel to the floor section.

In an embodiment, the floor section is provided with an interface unit arranged at the transfer unit location, wherein the interface unit is connectable to the transfer unit at least when the transfer unit is arranged substantially at the transfer unit location on the floor section.

In an embodiment, the interface unit is arranged to provide a connection between the transfer unit and technical service connections for providing facilities to the transfer unit, wherein the facilities comprises one or more of a power supply, a water supply and/or drain, a vacuum duct and an air supply.

In an embodiment, the interface unit comprising an actuator for moving the interface unit or a coupling unit of the interface unit, towards the transfer unit to provide said connection, preferably wherein the actuator is arranged for moving the interface unit or said coupling unit is a substantially vertical direction.

In an embodiment, the floor section comprises a pedestal, in particular a substantially rigid and/or monolithic pedestal for carrying said transfer unit. In an embodiment, the pedestal is arranged for carrying the enclosure, preferably in a substantially rigid and/or fixed position with respect to the pedestal.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 1 schematically shows a first embodiment of an assembly according to the invention, FIGS. 2A, 2B and 2C schematically show a second embodiment of an assembly according to the invention, FIGS. 3A, 3B, 3C and 3D schematically show a third embodiment of an assembly according to the invention, FIG. 4 shows a fourth embodiment of an assembly according to the invention in more detail.

DETAILED DESCRIPTION OF THE INVENTION

Figure 2C:
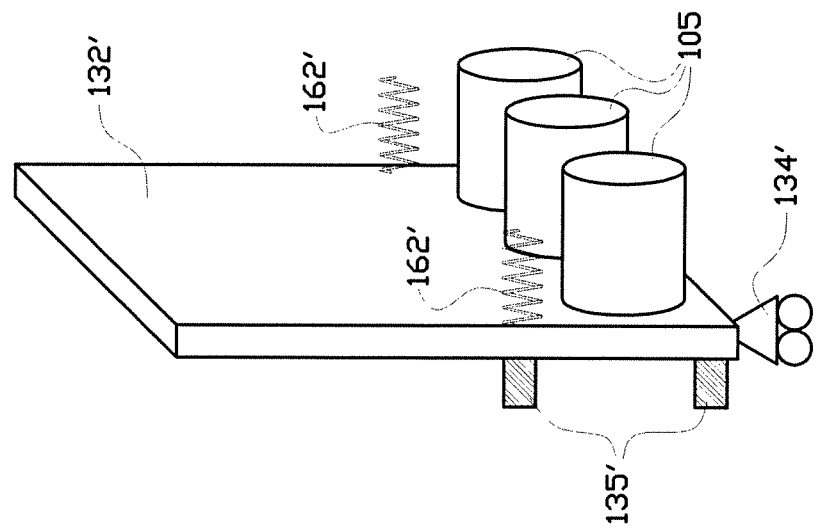

The figures schematically shows various examples of an assembly according to the invention, which assembly preferably provides an enclosure for a target processing machine as for example described in WO2012/080278 and WO2013/

037802 which are assigned to the owner of the present invention and are all hereby incorporated by reference in their entirety.

In a first example as shown in FIG. 1, the assembly 1 comprises an enclosure 2 and a transfer unit 3. The enclosure 2 preferably comprises a base plate 21 for arranging said target processing machine thereon, side wall panels 22, which are fixed to said base plate 21, and a top wall panel 23 which is fixed to said side wall panels 22. In addition, the enclosure 2 comprises an access opening 24 in a side wall of the enclosure 2 facing the transfer unit 3. The access opening 24 in this example is substantially the same as shown the example of FIG. 5, and the access opening 24 has a size of substantially an entire side wall of the enclosure 2.

The transfer unit 3, as shown in FIG. 1, comprising one or more transfer elements, in particular four wheels 31 for moving the transfer unit 3 with respect to the enclosure 2, in particular the base plate 21 thereof. The transfer unit 3 further comprises a door panel 32 which is arranged for closing the access opening 24, wherein the door panel 32 is movably mounted to the transfer unit 3, in particular by means of a flexible coupling 33.

In order to use the enclosure 2 for housing a charged particle lithography apparatus, the space inside the enclosure 2 must be evacuated to provide a vacuum environment inside the enclosure 2. For operating a charged particle lithography apparatus a vacuum of at least $10^{-6}$ mbar is typically required. In order to obtain and maintain the required vacuum environment, the wall panels 22 are fixed to the base plate 21 in order to provide a fluid tight or vacuum tight connection, for example by arranging sealing members, such as O-rings or C-rings or the like, between the base plate 21 and adjacent side wall panels 22 and between the top wall panel 23 and adjacent side wall panels 22.

In order to position the door panel 32 correctly against the enclosure 2, the door panel is movably arranged on the transfer unit. Preferably the door panel is movable with respect to the transfer unit at least in a translation along the y direction, preferably also in a rotation Rx around the x-axis (which is directed substantially transverse to the plane of the paper in FIG. 1), and preferably in a rotation Rz around the z-axis. One or more of these degrees of freedom are established by the flexible coupling 33, which for example comprises an elastic coupling, such as a spring coupling as schematically indicated in FIG. 1. The spring coupling is on a first side connected to the door panel 33, and on a second side, facing away from the first side, connected to the transfer unit 3.

As further indicated in FIG. 1, the door panel 32 may carry a utility device 5, such as a vacuum pump for evacuating the inner side of the enclosure 2, at least when the door panel 32 is arranged for substantially closing the access opening 24.

In addition the transfer unit 3 can be provided with a transfer device 6 for transferring substrates into and out of the enclosure 2, as for example described in WO2012/080278. The door panel 32 is provided with a transit opening 35 and wherein the transfer device 6 which is arranged at a fixed and/or rigid position on said transfer unit 3, substantially adjacent to the transit opening 35. The transfer device 6 comprises a load lock system which is connected to the door panel 32 via the flexible coupling 33, which preferably comprises a vacuum bellow, which surrounds the transit opening 35, as schematically depicted in FIG. 1.

Figure 2B:
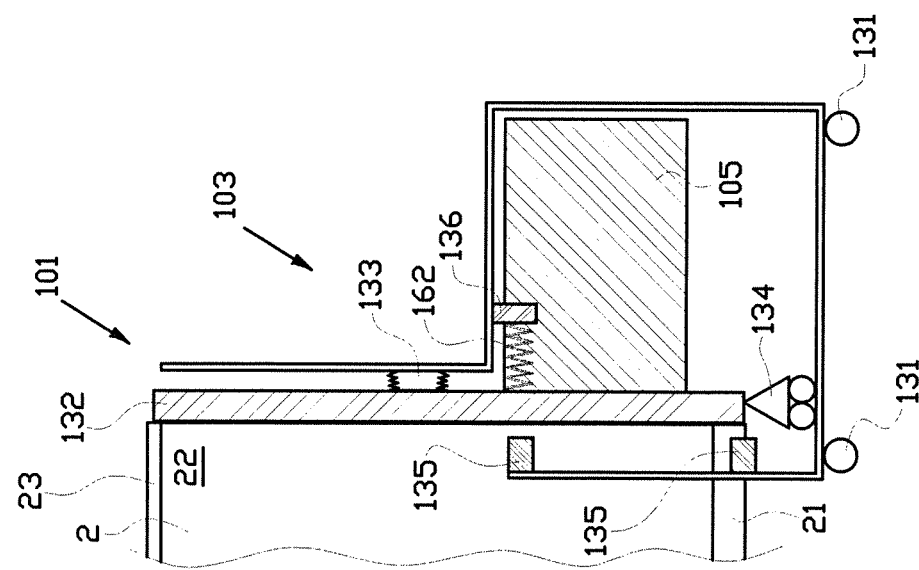

In the second example, as shown in FIGS. 2A and 2B, the assembly 101 comprises an enclosure 2 and a transfer unit 103. The transfer unit 103, as shown in FIG. 2A, comprising one or more wheels 131 for moving the transfer unit 103 with respect to the enclosure 2. The transfer unit 103 further comprises a door panel 132 which is arranged for closing the access opening 24, wherein the door panel 132 is mounted to the transfer unit 103 by means of a flexible coupling 133. Again the door panel 132 may be provided with a utility device 105.

In the example as shown in FIGS. 2A and 2B, the door panel 132 is arranged to be substantially fixed in the Z direction, for example using a roller support 134. Although substantially fixed in the z direction the flexible coupling 133 allows at least in a translation along the y direction, preferably also in a rotation Rx around the x-axis (which is directed substantially transverse to the plane of the paper in FIG. 1), and preferably in a rotation Rz around the z-axis.

The transfer unit 103 according to this second example, further comprises end-stops 135, which limit the movement of the door panel 132 in the y direction. In the situation where the transfer unit 103 is at a distance with respect to the enclosure 2, a spring 162 urges the door panel 132 towards the end-stop 135. The spring 162 provides a preload force which pushes the door panel 132 against the end-stops 135, which substantially prevent any movement in the y direction or any rotation Rx, Rz of the door panel 132, at least when the door panel 132 is not positioned against the enclosure 2, as shown in FIG. 2A. A first end of the spring 162 is connected to a connector 136 of the transfer unit 103, whereas a second end, facing away from the first end is arranged against the door panel 132.

When the transfer unit 103 is moved towards the enclosure 2, as shown in FIG. 2B, and the door panel 132 abuts against the enclosure 2, the door panel 132 is pushed off the end-stops 135 and is substantially movable in the y direction and/or rotate around the x-axis and z-axis. In this situation, the door panel 132 can adapt its position to the enclosure 2 and be compliant to the enclosure 2 in order to assist in obtaining the desired closing off and/or sealing the enclosure 2.

In the second example as shown in FIGS. 2A and 2B, the spring 162 for providing the pre-load is arranged at a side of the door panel 132 facing away from the enclosure 2, whereas the end-stops 135 are arranged at a side of the door panel 132 which faces towards the enclosure, at least when the door panel 132 is arranged adjacent and/or in front of the enclosure 2, in particular the access opening 24 thereof. In addition, the spring 162 for providing the pre-load is fixedly connected to the transfer unit 103 via the connector 136, and the end-stops 135 are fixedly connected to the transfer unit 103. However the same functioning can also be obtained by the mechanical reversal as shown in an alternative embodiment of the second example in FIG. 2C, where the springs 162' are connected to the door panel 132', and/or the end-stops 135' are connected to the door panel 132'.

Figure 3B:
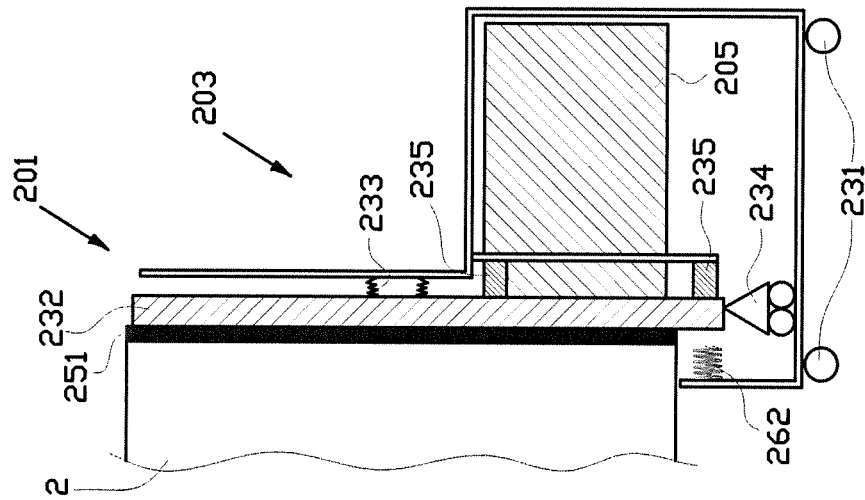
Figure 3A:
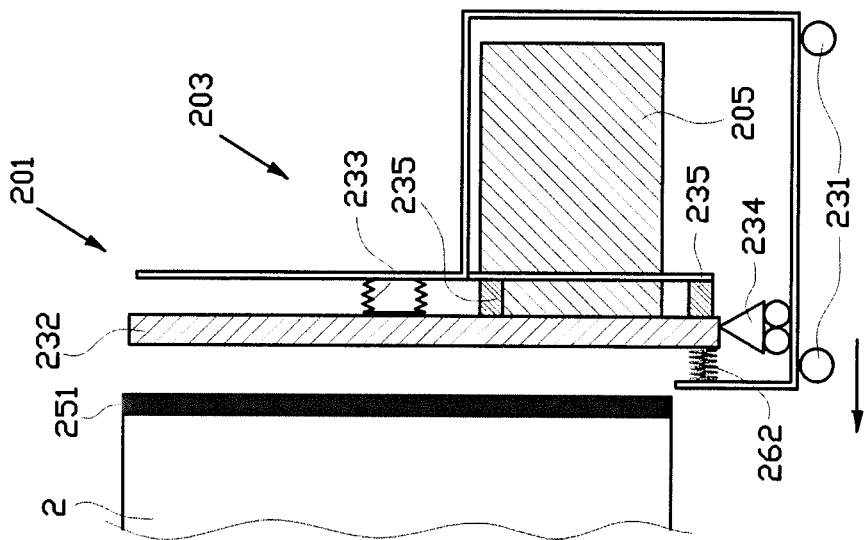
Figure 3D:
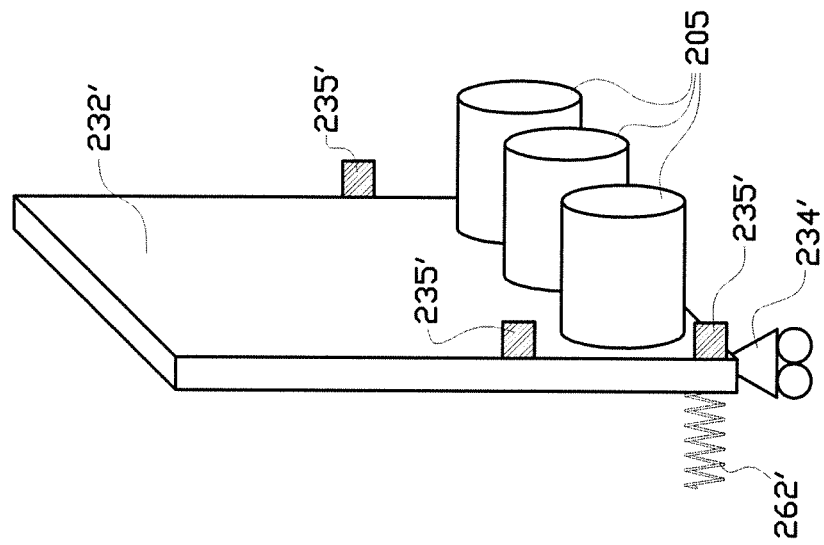
Figure 3C:
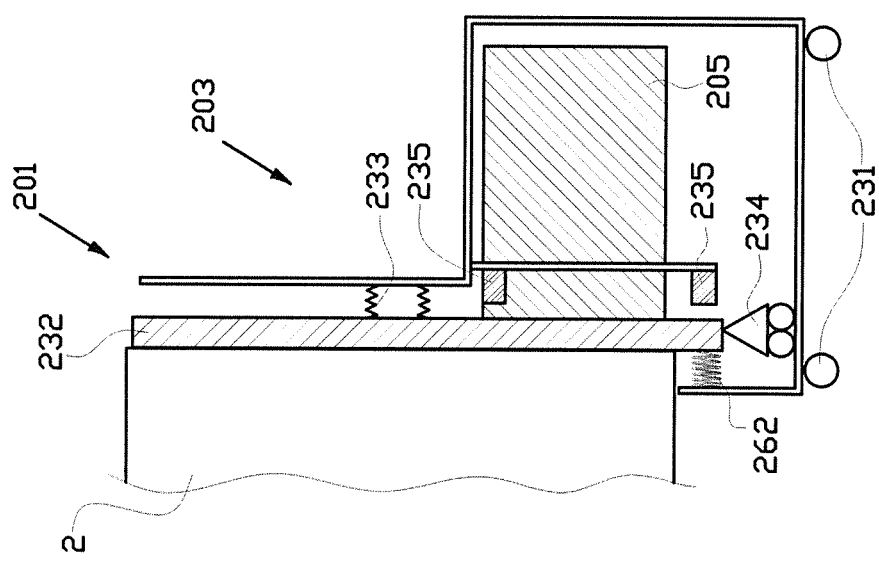

In a third example, as shown in FIGS. 3A, 3B and 3C, the assembly 201 comprises an enclosure 2 and a transfer unit 203. The transfer unit 203, as shown in FIG. 3A, comprising one or more wheels 231 for moving the transfer unit 203 with respect to the enclosure 2. The transfer unit 203 further comprises a door panel 232 which is arranged for closing the access opening 24, wherein the door panel 232 is mounted to the transfer unit 203 by means of a flexible coupling 233. Again the door panel 132 may be provided with a utility device 205.

In the example as shown in FIGS. 3A, 3B and 3B, the door panel 232 is arranged to be substantially fixed in the Z direction, for example using a roller support 234. Although substantially fixed in the z direction the flexible coupling 233 allows at least in a translation along the y direction, preferably also in a rotation Rx around the x-axis (which is directed substantially transverse to the plane of the paper in FIG. 1), and preferably in a rotation Rz around the z-axis.

The transfer unit 203 according to this third example, further comprises end-stops 235, which limit the movement of the door panel 232 in the y direction. In the situation where the transfer unit 203 is at a distance with respect to the enclosure 2, a spring 262 urges the door panel 232 towards the end-stops 235. The spring 262 provides a preload force which pushes the door panel 232 against the end-stops 235, which substantially prevent any movement in the y direction or any rotation Rx, Rz of the door panel 232, at least when the door panel 232 is not positioned against the enclosure 2, as shown in FIG. 3A. A first end of the spring 262 is connected to the transfer unit 203, whereas a second end, facing away from the first end is arranged against the door panel 232.

When the transfer unit 203 is moved towards the enclosure 2, as shown in FIG. 2B, and the door panel 232 abuts against the enclosure 2, in particular against a pre-vacuum seal 251 arranged around the access opening, the door panel 232 pushes against the pre-vacuum seal 251 and compresses said pre-vacuum seal 251. In this situation, the door panel 232 is arranged between the pre-vacuum seal 251 and the end-stops 235. This allows the inside of the enclosure 2 to be evacuated to obtain a reduced air pressure inside the enclosure 2. Subsequently, the ambient air pressure pushes the door panel 232 further against the enclosure 2 and pulls the door panel 232 from the end-stops 235, as shown in FIG. 3C. The door panel 232 is now substantially movable in the y direction and/or rotate around the x-axis and z-axis. In this situation, the door panel 232 can adapt its position to the enclosure 2 and be compliant to the enclosure 2 in order to assist in obtaining the desired closing off and/or sealing the enclosure 2. This allows the inside of the enclosure 2 to be evacuated further to obtain and maintain the desired vacuum inside the enclosure 2.

In the third example as shown in FIGS. 3A, 3B and 3C, the spring 262 for providing the pre-load is arranged at a side of the door panel 232 facing towards the enclosure 2, whereas the end-stops 235 are arranged at a side of the door panel 232 which faces away from the enclosure 2, at least when the door panel 232 is arranged adjacent and/or in front of the enclosure 2, in particular the access opening 24 thereof. In addition, the spring 262 for providing the pre-load is fixedly connected to the transfer unit 203, and the end-stops 235 are fixedly connected to the transfer unit 103. However the same functioning can also be obtained by the mechanical reversal as shown in an alternative embodiment of the second example in FIG. 3D, where the spring 262' is connected to the door panel 232', and/or the end-stops 235' are connected to the door panel 232'.

In a more elaborate fourth example as shown in the FIGS. 4-13. As shown in FIG. 4 and in the exploded view of FIG. 5, the assembly 301 comprises an enclosure 302 and a transfer unit 303. The enclosure 302 comprises a base plate 321 for arranging said target processing machine thereon, side wall panels 322, which are fixed to said base plate 321, and a top wall panel 323 which is fixed to said side wall panels 322. In addition, the enclosure 302 comprises an access opening 324 in a side wall of the enclosure 302.

Figure 7:
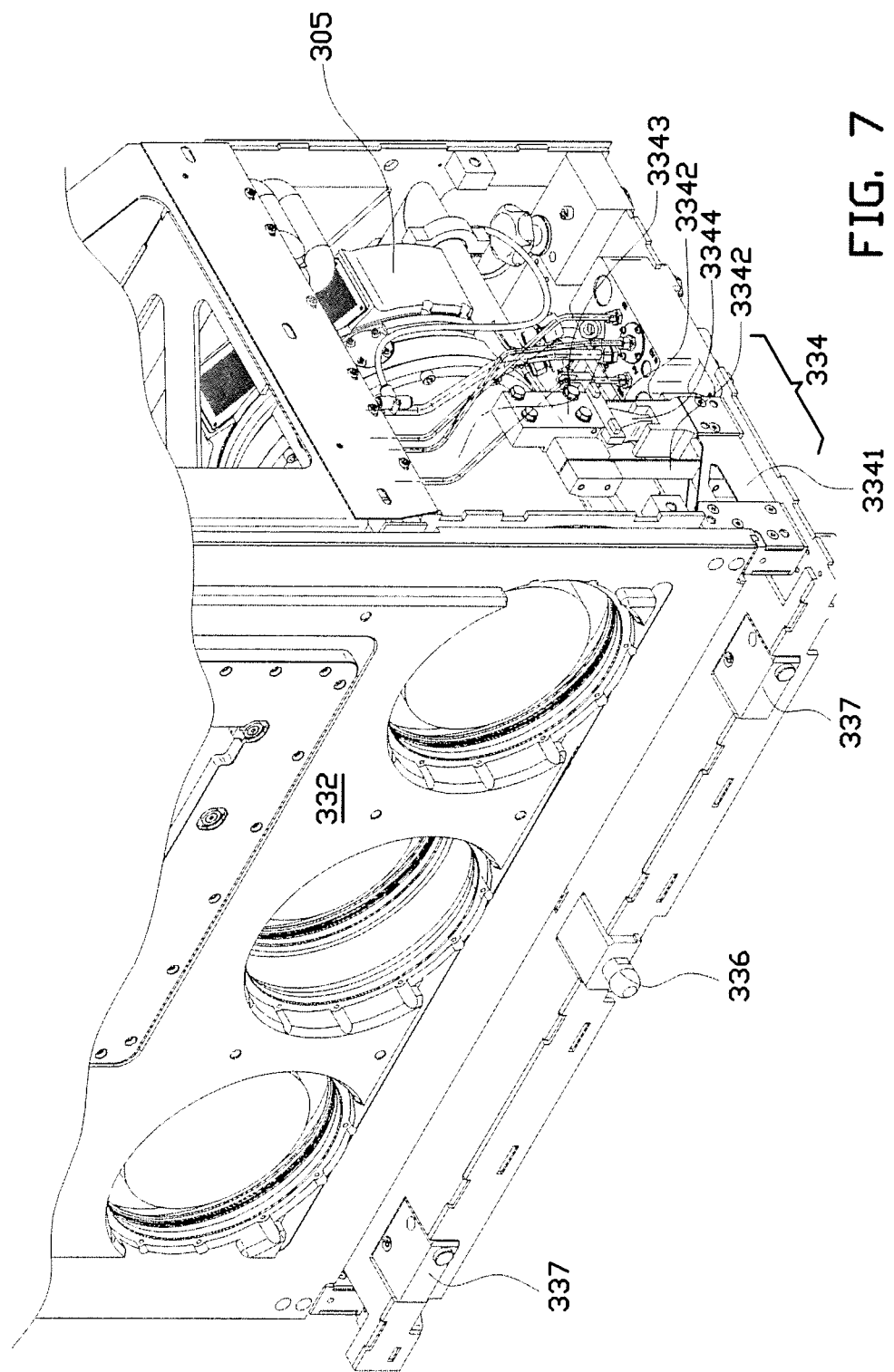
FIG. 7 shows a detail of one of the flexible couplings between the door panel and the transfer unit.
Figure 8:
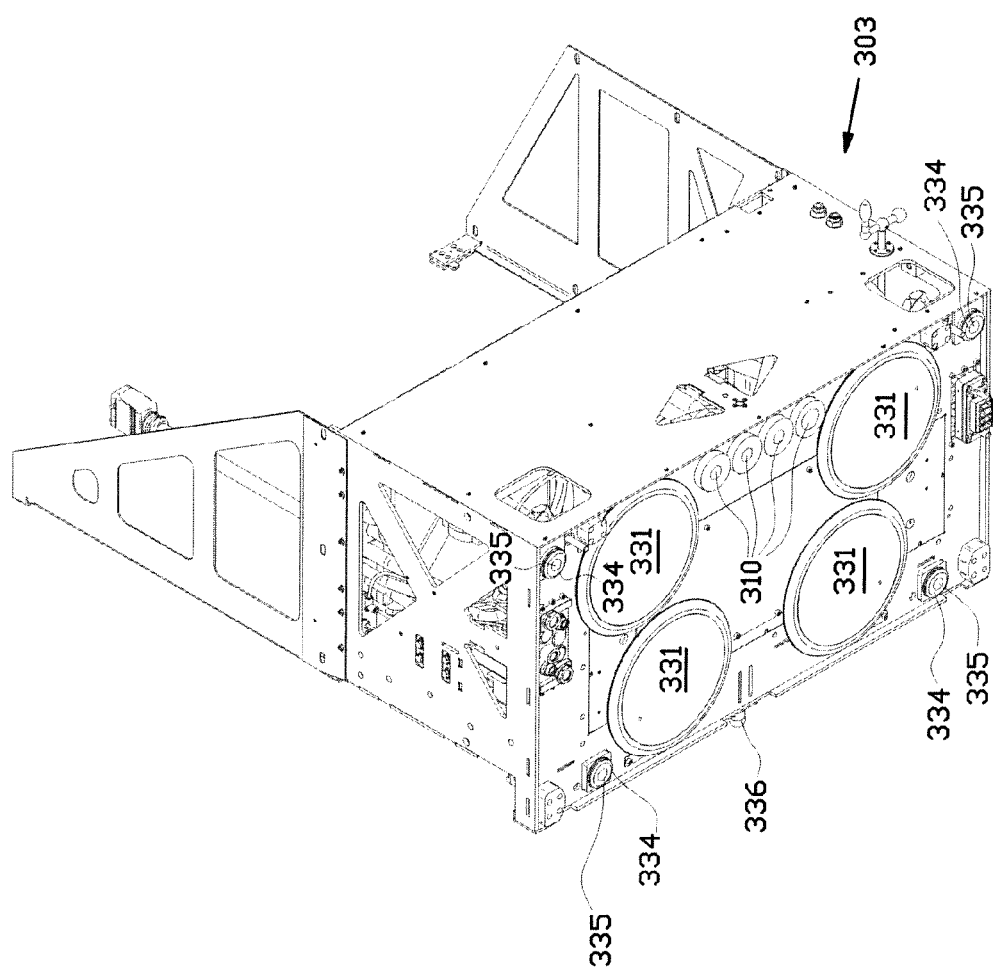
FIG. 8 shows bottom side of the transfer unit of FIG. 4.

The transfer unit 303 comprising one or more transfer elements, in particular four air pads 331 as shown in FIG. 8, for moving the transfer unit 303 with respect to the enclosure 302, in particular the base plate 321 thereof. The transfer unit 303 further comprises a door panel 332 which is arranged for closing the access opening 324, wherein the door panel 332 is movably mounted to the transfer unit 303 by means of a flexible coupling 333, 333' and 334 (in FIG. 7), as will be described in more detail below.

As shown in FIG. 7, one lower edge of the door panel 332 rests on top of a support block 3341, which is suspended via two, substantially vertically extending, leaf springs 3342 from a mounting block 3343 fixedly connected to the transfer unit 303. This mounting allows the support block 3341 to move along the y direction with respect to the transfer unit 303. In this particular embodiment the extend of movement in the y direction is limited using a limiter 3344 arranged between the support block 3341 and the mounting block 3343. It is noted that the same construction is also arranged at the other lower edge of the door panel 332, in order to support the door panel 332.

In addition the door panel 332 is connected to the transfer unit 303 via two, substantially horizontal extending, leaf springs 333, 333'. These leaf springs 333, 333' are on one side connected to the door panel 332, and on the other side, facing away from the one side, to a mounting member 304, 304' of the transfer unit 303.

In order to use the enclosure 302 for housing a charged particle lithography apparatus, the space inside the enclosure 302 must be evacuated to provide a vacuum environment inside the enclosure 302. For operating a charged particle lithography apparatus a vacuum of at least $10^{-6}$ mbar is typically required. In order to obtain and maintain the required vacuum environment, the wall panels 322 are fixed to the base plate 321 in order to provide a fluid tight or vacuum tight connection, for example by arranging sealing members, such as O-rings or C-rings or the like, between the base plate 321 and adjacent side wall panels 322 and between the top wall panel 323 and adjacent side wall panels 322.

The enclosure 302 of this example comprises a door frame 325 which surrounds the access opening 324 having a size of substantially an entire side wall of the enclosure 302. The enclosure 302, in particular the door frame 325, is provided with a pre-vacuum seal 351 and a vacuum seal 351, which are both arranged around the access opening 324. In particular the vacuum seal 352 is arranged around the access opening 324, and the pre-vacuum seal 351 is arranged around the vacuum seal 352, as shown in the detail view of FIG. 9. The pre-vacuum seal 351 comprises C-ring having a rubber flap which extends out of the plane of the door frame 325 in an outward oriented direction with respect to the enclosure 302, which C-ring in arranged in a first recess in the door frame 325. The vacuum seal 351 comprises an O-ring which is arranged in a second recess in the door frame 325. The second recess extends around the access opening 324, and the first recess extend around the second recess.

The top wall panel 323 is provided with an interface box 326 comprising a number of passages which are arranged for feeding data communication cables, electrical supply cables, cooling water tubes, and the like into the enclosure 302 for connection to the machine inside the enclosure 302. The passages which are not in use are sealed with a cover plate 327. In use, the passages provide a vacuum-tight feed-through for said data communication cables, electrical supply cables, cooling water tubes, and the like.

The base plate 321 of the example of FIG. 4 is arranged on top of a pedestal 404. The base plate 321 is arranged at a fixed and/or rigid position on said pedestal 404. The base plate 321 is preferably made from a thick and rigid block of metal such as aluminium. The base plate 321 includes supporting legs for supporting the base plate 321 and the target processing machine on the pedestal 404. In addition the pedestal 404 is provided with support surfaces 441, which together with the supporting legs of the base plate 321 provide a kinematic mount of the base plate 321 on the pedestal 404, which provides the fixed (X, Y, Z) and rigid (Rx, Ry, Rz) position of the base plate 321 on the pedestal 404. Preferably the supporting legs and the base plate 321 are formed as a unity.

For at least assisting the positioning of the base plate 321 on the pedestal 404, the base plate 321 comprise guiding pins 501, and the pedestal 404 comprises receptacle openings 502 which receive the guiding pins 501 during a lowering of the enclosure 202 on to the pedestal 404.

Figure 5:
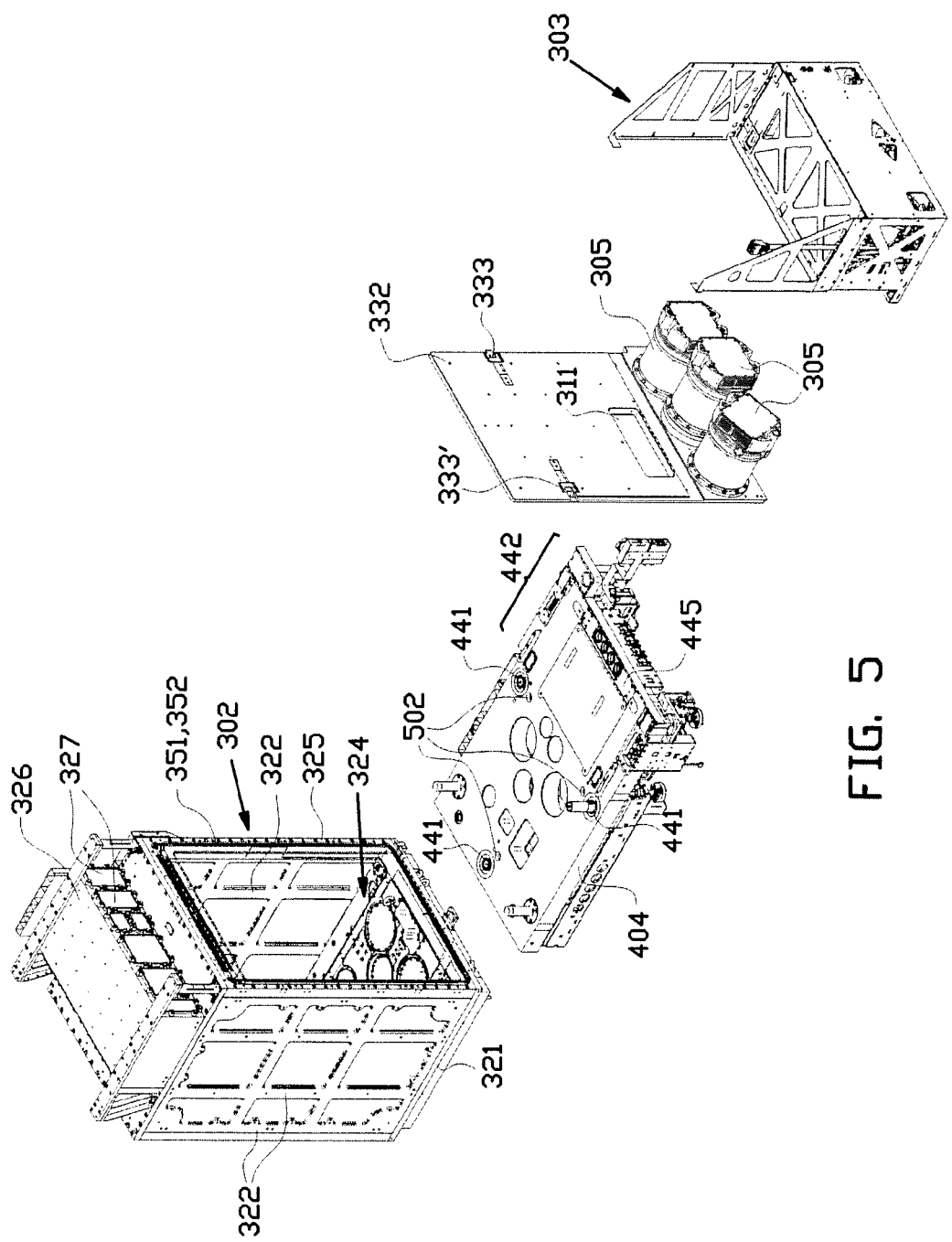
FIG. 5, shows an exploded view of the assembly of FIG. 4.
Figure 10:
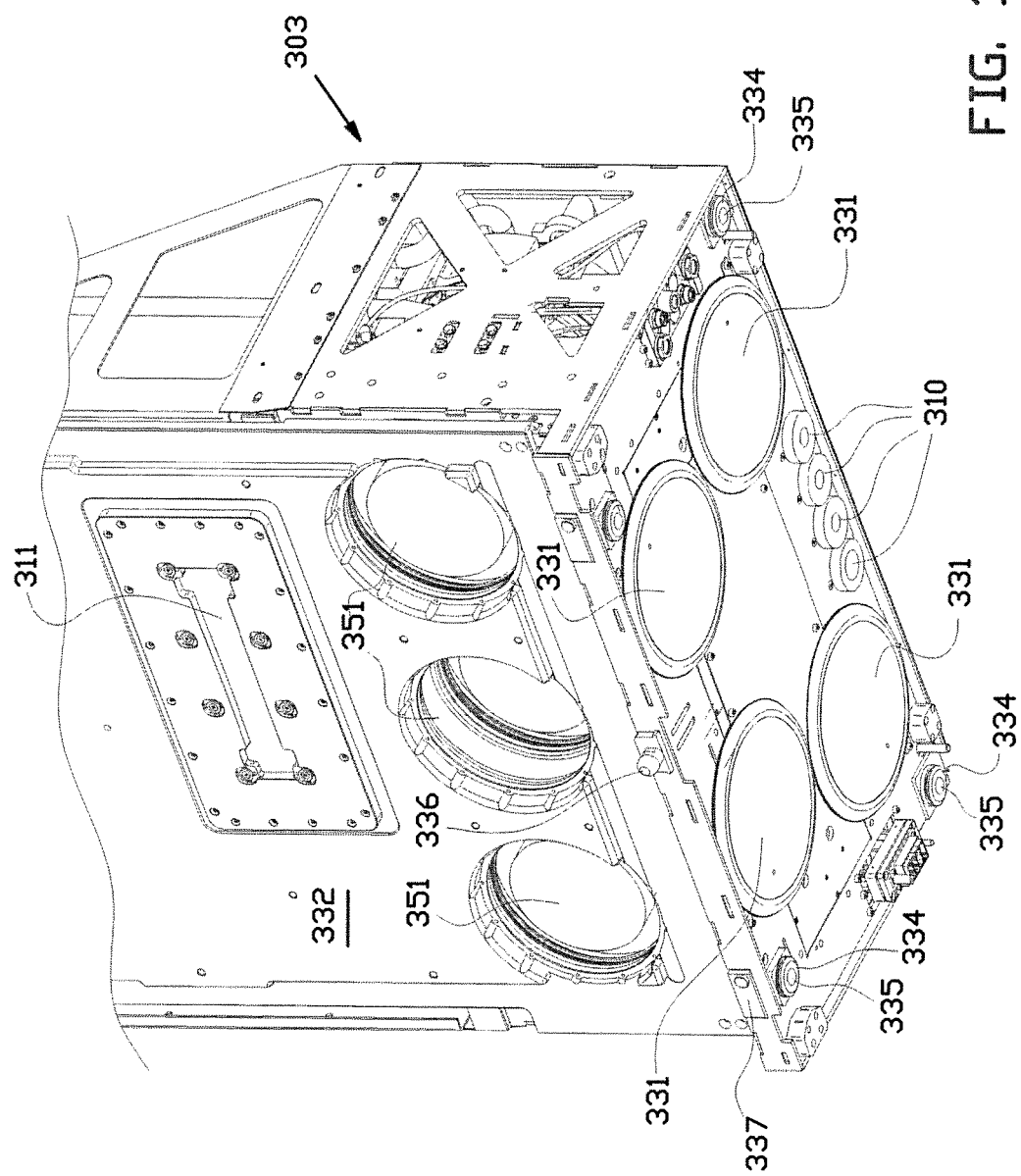
FIG. 10 shows a detail of the part of the transfer unit, which faces the base plate at least in the assembled state as shown in FIG. 4.
Figure 12:
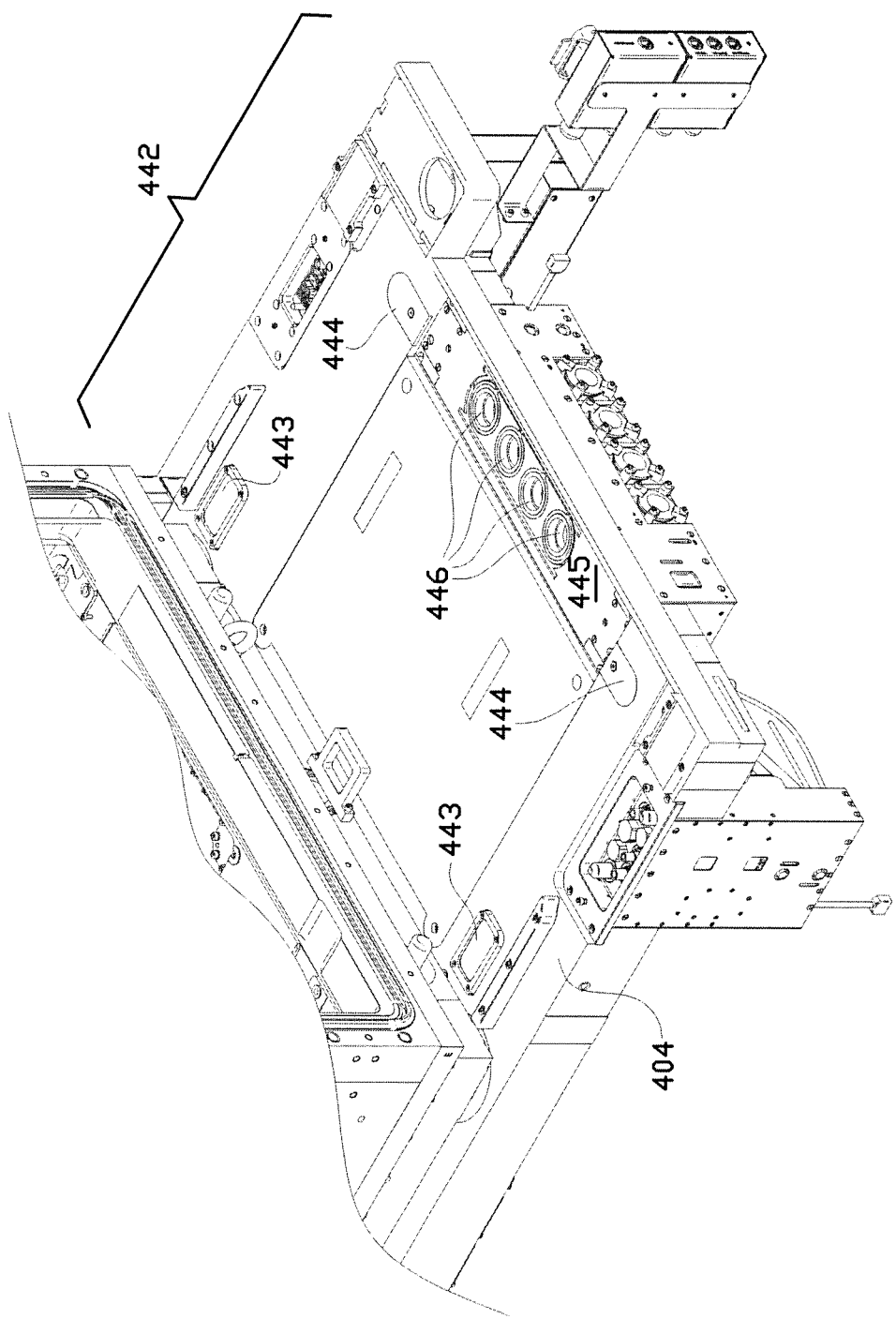
FIG. 12 shows a top view of the pedestal part in front of the enclosure.

The pedestal 404 is provided with a transfer unit location 442 for arranging the transfer unit 303 thereon, as shown in FIGS. 5 and 12. The pedestal 404, in particular the transfer unit location 442 thereof, comprises support member contact surfaces 443, 444. Each of said support member contact surfaces 443, 444 is arranged to receive one of the support members 334 arranged at the bottom side of the transfer unit 303, as shown in FIGS. 8 and 10. The support members 334 and the support member contact surfaces 443, 444 are arranged to provide a fixed distance between the bottom side of the transfer unit 303 and the pedestal 404, thus to provide a fixed Z position of the transfer unit 303 on the pedestal 404. By using multiple support members 334, the support members 334 and the support member contact surfaces 443, 444 are arranged to provide a fixed rotational orientation Rx, Ry around an axis which extends substantially parallel to the base plate 321, thus to provide a rigid Rx and a rigid Ry position of the transfer unit 303 on the pedestal 404.

It is noted herein that the support member 334 of this particular example each comprises a ball 335 which is rotatable arranged in a holder. Thus the support member 334 can act as a ball-bearing, and allows a rolling movement of the transfer unit 303 over the support member contact surfaces 443, 444 of the pedestal 404.

Figure 9:
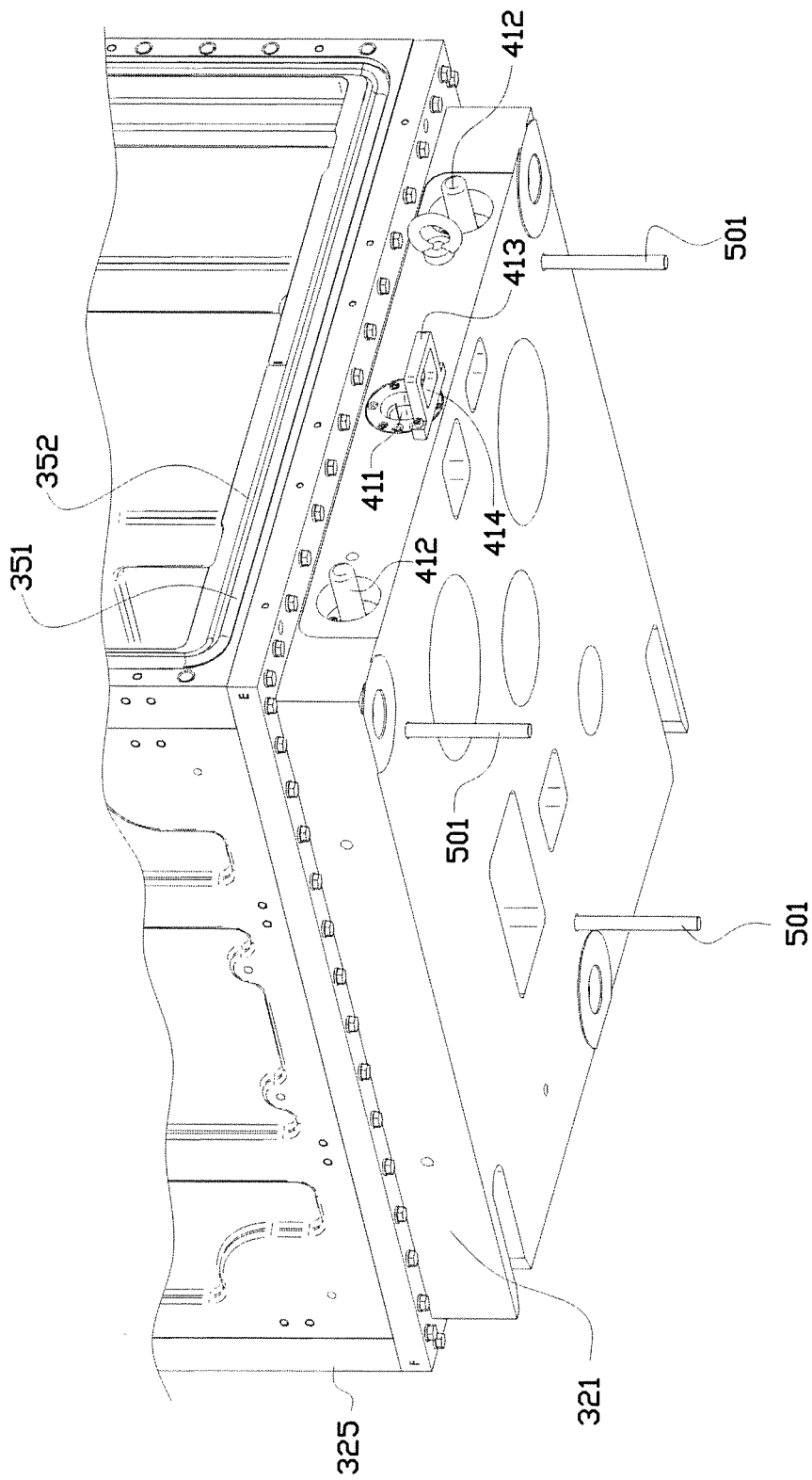
FIG. 9 shows a detail of the part of the base plate below the access opening in the enclosure, which faces the transfer unit at least in the assembled state as shown in FIG. 4.

To further assist the accurate alignment of the transfer unit 303 with respect to the base plate 321, the base plate comprises a socket 411 below the access opening 324 in the enclosure 302, as shown in FIG. 9. In addition the transfer unit 303 comprises a spigot 336, as shown in FIGS. 6, 7, 8 and 10. The spigot 336 is insertable in the socket 411 to provide a fixed position (X, Y) of the transfer unit 303 with respect to the base plate 321. It is noted that the spigot may also be arranged on the base plate 321 and the socket may be arranged in the transfer unit 303 to obtain the same result.

In addition, the base plate 321 comprises two abutment members 412, which are arranged at either side of the socket 411 and at a distance from the socket 411, as shown in FIG. 9. The transfer unit 303 comprises two contact surfaces 337 arranged at either side of the spigot 336 and at a distance from the spigot 336. When the transfer unit 303 is arranged in front of the base plate 321 and the spigot 336 is inserted in the socket 411, the abutment member 412 are arranged to abut against the contact surfaces 337 to provide the fixed rotational orientation Rz between the base plate 321 and the transfer unit 303.

Figure 11:
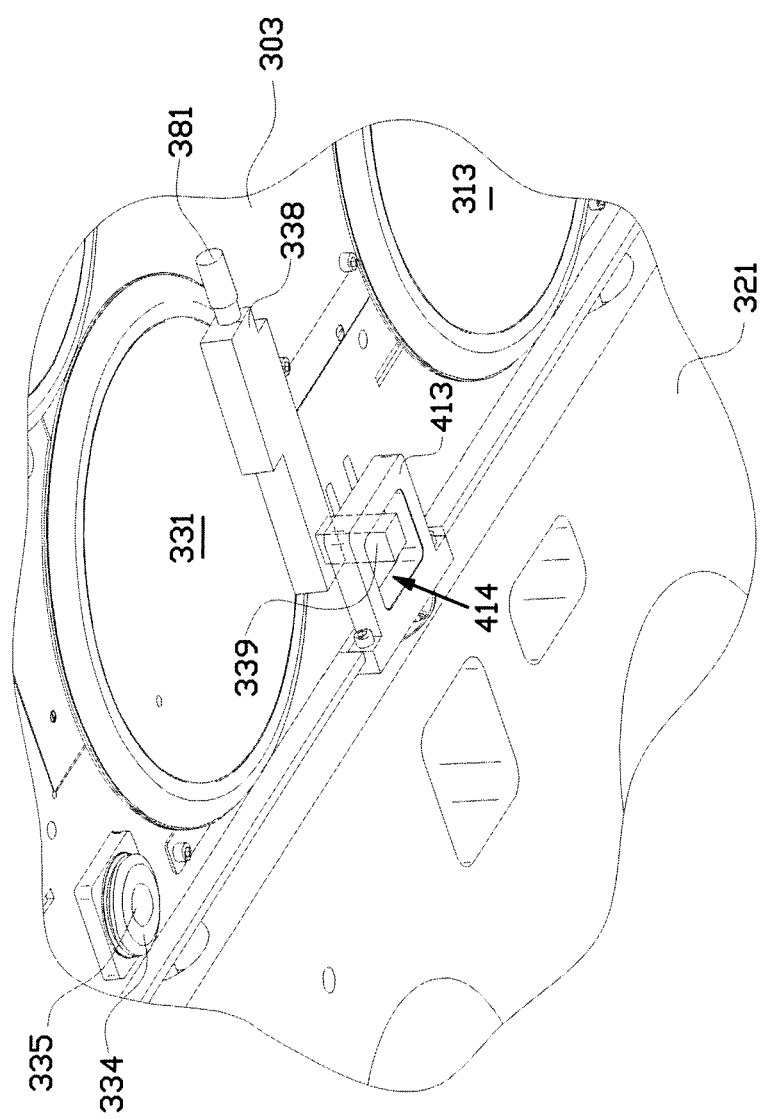
FIG. 11 shows a detail of the bottom side of the transfer unit according to a further embodiment.

In order to provide the desired abutment of the abutment member 412 to the contact surfaces 337, the base plate 321 comprises a preload member 413 comprising an aperture 414, and the transfer unit 303 comprises a complementary preload member 338 comprising a hook 339, as shown in FIG. 11. When the transfer unit 303 is arranged in front of the base plate 321, and the spigot 336 is inserted in the socket 411, the hook 339 is arranged to move into the aperture 414 for coupling the preload member 414 and the complementary preload member 338 to each other. In addition, the hook 339 is coupled to an actuator 381 for providing a preload force for assisting in positioning the transfer unit 303 with respect to the base plate 321, in particular in order to position the abutment member 412 against the contact surfaces 337.

Accordingly, in the present example, the alignment and positioning of X, Y and Rz of the transfer unit 303 with respect to the base plate 321, and any machine which is fixedly and rigidly positioned on said base plate 321, is provided by the alignment members between the base plate 321 and the transfer unit 303, in particular by the spigot 336 and socket 411, and the abutment members 412 and the contact surfaces 337. The alignment and positioning of Z, Rx and Ry of the transfer unit 303 with respect to the base plate 321 are provided via the mounting and positioning of the base plate 321 and the transfer unit 303 on the pedestal 404.

In addition, the preload force pushes the door panel 332 towards the enclosure 302, in particular against the pre-vacuum seal 351. This allows the inside of the enclosure 302 to be evacuated to obtain a reduced air pressure inside the enclosure 302. Subsequently, the ambient air pressure pushes the door panel 332 against the door frame 325, in particular against the vacuum seal 352. This allows the inside of the enclosure 302 to be evacuated further to obtain and maintain the desired vacuum inside the enclosure 302. Since the flexible coupling 333, 333' and 334 between the door panel 332 and the transfer unit 303 is arranged to allow a movement of the door panel 332 with respect to the transfer unit 303, preferably at least in a direction Y towards and/or away from the enclosure 302, a movement of the door panel 332 due to the evacuation of the enclosure 302, has no influence on the alignment of the transfer unit 303 with respect to the base plate 321.

In this example, the door panel 303 has substantially the same size as a side wall panel. This allows for a large opening 324 in the enclosure 302 to provide easy access to the inside of the enclosure 302.

The transfer unit 303 with the door panel 332 is detachable from the enclosure 302, in particular the transfer unit 303 is removable from the enclosure 302 in its entirety, and can be moved towards or away from the enclosure 302 using the air pads 331.

Figure 13:
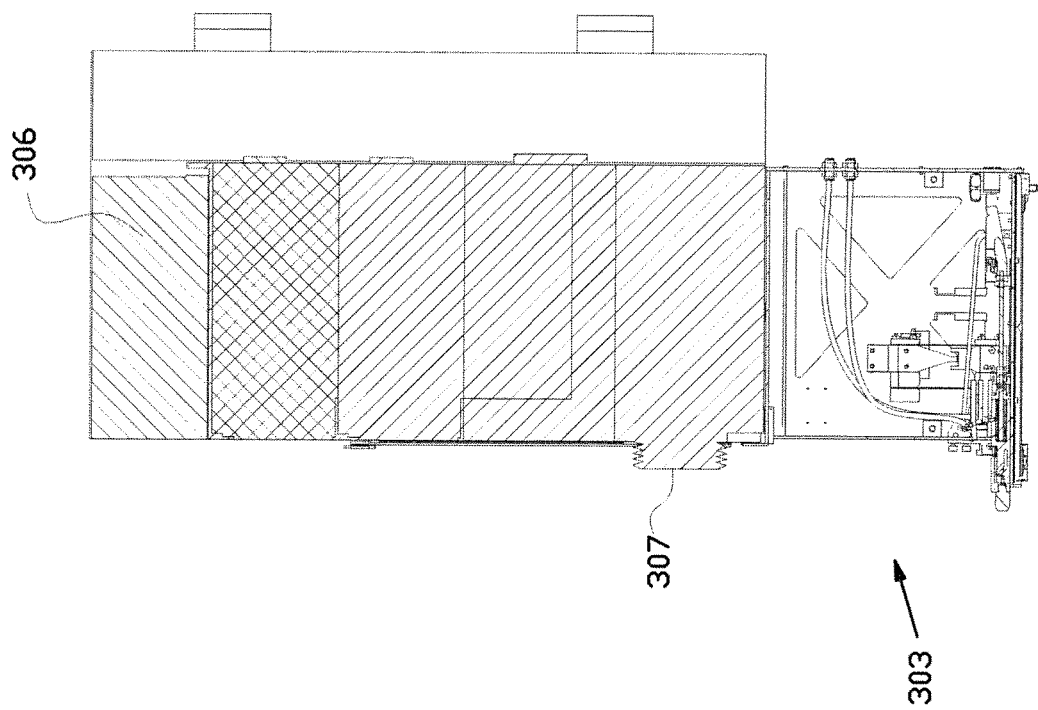
FIG. 13 shows a transfer unit comprising a transfer device for transferring substrates into and out of the enclosure.

In an embodiment the transfer unit 303 is provided with active components, such as a transfer device 306, as schematically indicated in the cross section of the transfer unit 303 in FIG. 13, which active components 306 assist is the functioning of the assembly 301 and/or the target processing machine inside the enclosure 302. For such an embodiment, it is advantageous to provide the pedestal 404 with an interface unit 445 arranged at the transfer unit location 442. The interface unit 445 is connectable to the transfer unit 303 when the transfer unit 303 is arranged substantially at the transfer unit location 442 on the pedestal 404.

The interface unit 445 and/or the pedestal 404, is for example provided with a interface unit actuator to move the interface unit 445 upward to the transfer unit 303 to provide a connection from the conduits 446 in the interface unit 445, as shown in FIG. 12, to corresponding conduits 310 in the transfer unit 303, as shown in FIG. 8.

In the examples shown in FIGS. 5, 6, 7 and 10, the door panel 332 is provided with one or more vacuum pumps 305, in particular turbomolecular pumps, which are arranged at the side of the door panel 332 facing away from the inside of the enclosure 302. At the position of the vacuum pumps 305, the door panel 332 is provided with large openings 351 to provide a fluid connection between the inside of the enclosure 302 and the vacuum pumps 305. The vacuum pumps 305 are connected to one or more of said conduits 310, preferably via a flexible conduit or a bellow, in order to preserve the movable connection between the door panel 332 and the transfer unit 303.

An additional advantage of the flexible coupling of the door panel 332 to the transfer unit 303 is, that the flexible coupling can absorb vibrations from the vacuum pumps 305.

Figure 6:
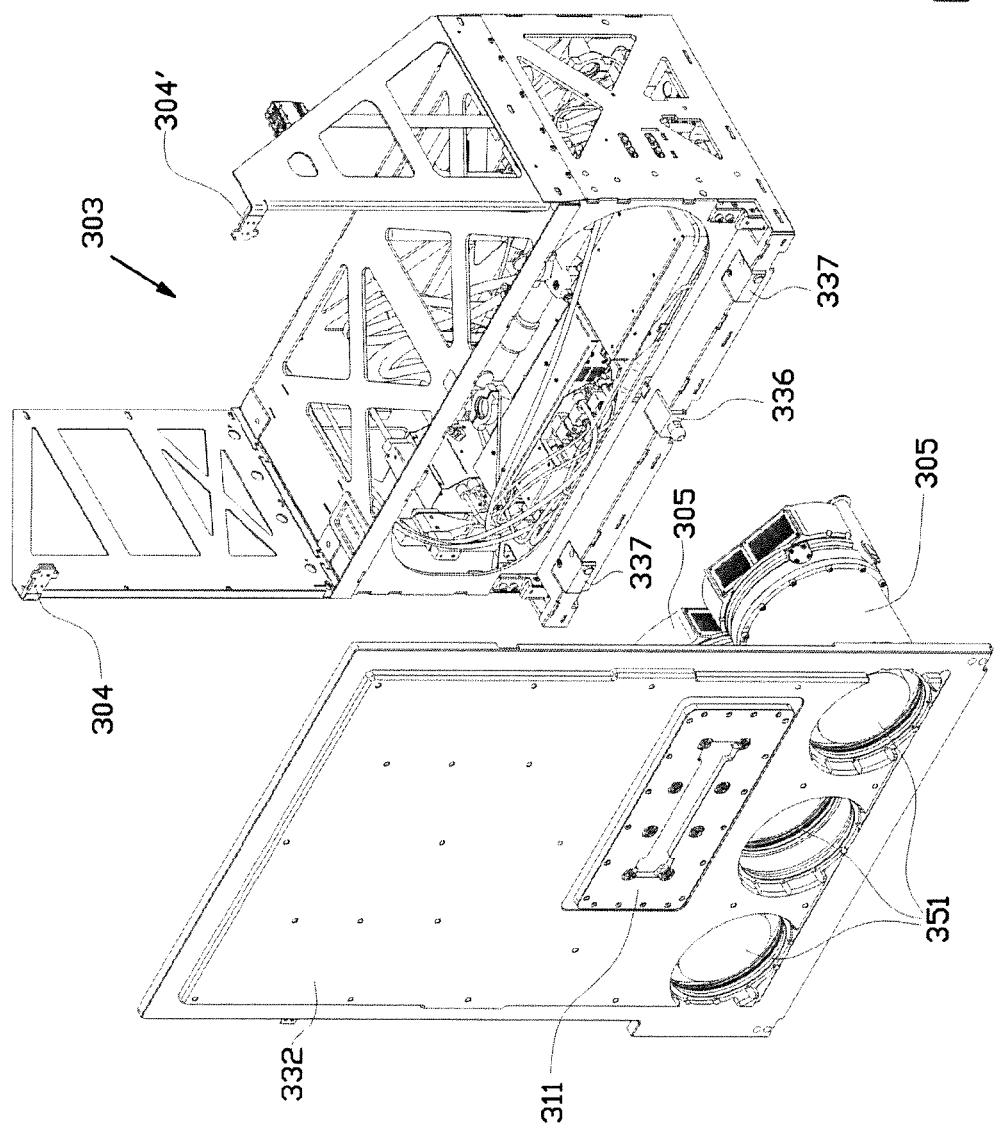
FIG. 6 shows an exploded view of the transfer unit and the door panel of the assembly of FIG. 4.

Because of the accurate alignment of the transfer unit 303 and the base plate 321, the transfer unit 303 can be provided with a transfer device 306 for transferring substrates into and out of the enclosure 302, as for example described in WO2012/080278. The door panel 332 is provided with a transit opening 311 and the transfer device 306 which is arranged at a fixed and/or rigid position on said transfer unit 303, substantially adjacent to the transit opening 311 as shown in FIGS. 6 and 10. The transfer device 306 comprises a load lock system which is connected to the door panel 332 via a flexible coupling 307, preferably via a vacuum bellow as schematically indicated in FIG. 13, which vacuum bellow is connected to the door panel 332 surrounding the transit opening 311.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the present invention relates to an assembly for enclosing a target processing machine. The assembly comprises an enclosure and a transfer unit. The enclosure comprises a base plate for arranging said target processing machine thereon, side wall panels, which are fixed to said base plate, and a top wall panel which is fixed to said side wall panels. In addition, the enclosure comprises an access opening in a side wall of the enclosure. The transfer unit comprising one or more transfer elements for moving the transfer unit with respect to the base plate. The transfer unit further comprises a door panel which is arranged for closing the access opening, wherein the door panel is movably mounted to the transfer unit by means of a flexible coupling which allows a movement of the door panel with respect to the transfer unit at least in a direction towards and/or away from the enclosure.

The invention claimed is:

1. Assembly for enclosing a target processing machine, wherein the assembly comprises an enclosure and a transfer unit, wherein the enclosure comprising:
   a base plate for arranging said target processing machine thereon,
   side wall panels, which are fixed to said base plate, and a top wall panel which is fixed to said side wall panels,
   wherein the enclosure comprises an access opening in a side wall of the enclosure,
   wherein the transfer unit comprising one or more transfer elements for moving the transfer unit with respect to the base plate, wherein the transfer unit comprises a door panel which is arranged for closing the access opening, wherein
   the door panel is mounted to the transfer unit by means of an flexible coupling, wherein the flexible coupling is arranged to allow a movement of the door panel with respect to the transfer unit at least in a direction towards and/or away from the enclosure at least when the transfer unit is arranged in front of the access opening of the enclosure, wherein the transfer unit with the door panel is arranged to be detachable from the enclosure.

2. Assembly according to claim 1, wherein the flexible coupling comprises a spring mount.

3. Assembly according to claim 1, wherein the door panel is arranged to abut against the enclosure for closing the access opening.

4. Assembly according to claim 1, wherein the transfer unit with the door panel is removable from the enclosure in its entirety.

5. Assembly according to claim 1, wherein the assembly comprises a positioning member and a complementary positioning member, wherein the positioning member is fixedly connected to the base plate and the complementary positioning member is fixedly connected to the transfer unit, wherein the positioning member and the complementary position member are arranged to align the base plate and the transfer unit with respect to each other, at least when the positioning member and the complementary positioning member are joined together.

6. Assembly according to claim 5, wherein the positioning member and the complementary positioning member each comprises one of a first alignment member and a first complementary alignment member to provide a fixed distance between the base plate and the transfer unit, at least when the first alignment member and the first complementary alignment member are joined together.

7. Assembly according to claim 6, wherein the first alignment member comprises a socket and wherein the first complementary alignment member comprises a spigot, wherein the spigot is insertable in the socket to provide the fixed distance between the base plate and the transfer unit, preferably wherein the spigot is insertable in the socket to provide a fixed position of the transfer unit with respect to the base plate.

8. Assembly according to claim 5, wherein the positioning member and the complementary positioning member each comprises one of a second alignment member and a second complementary alignment member to provide a fixed rotational orientation between the base plate and the transfer unit, in particular a fixed rotational orientation around an axis which extends substantially perpendicular to the base plate, at least when the second alignment member and the second complementary alignment member are joined together.

9. Assembly according to claim 8, wherein the second alignment member comprises a contact surface and the second complementary alignment member comprises an abutment member, wherein the abutment member is arrangeable to abut against the contact surface to provide the fixed rotational orientation between the base plate and the transfer unit.

10. Assembly according to claim 1, wherein the base plate comprises a preload member and the transfer unit comprises a complementary preload member, wherein the preload member and the complementary preload member are arranged to be coupled to each other and to provide a mechanical preload of the transfer unit with the door panel towards the enclosure.

11. Assembly according to claim 10, wherein the preload member and the complementary preload member comprises one of an aperture and a hook, wherein the hook is arranged to move into the aperture for coupling the preload member and the complementary preload member to each other.

12. Assembly according to claim 1, wherein the assembly comprises a pedestal, and wherein the pedestal is provided with a transfer unit location for arranging the transfer unit thereon.

13. Assembly according to claim 12, wherein the baseplate is arranged at a fixed and/or rigid position on said pedestal.

14. Assembly according to claim 12, wherein the transfer unit comprises support members and the transfer unit location of the pedestal comprises support member contact surfaces, wherein each of said support member contact surfaces is arranged to receive one of the support members, wherein the support members and support member contact surfaces are arranged to provide a fixed distance between the transfer unit and the pedestal and/or to provide a fixed rotational orientation around an axis which extends substantially parallel to the pedestal.

15. Assembly according to claim 12, wherein the pedestal is provided with an interface unit arranged at the transfer unit location, wherein the interface unit is connectable to the transfer unit at least when the transfer unit is arranged substantially at the transfer unit location on the pedestal.

16. Assembly according to claim 15, wherein the interface unit is arranged to provide a connection between the transfer unit and technical service connections for providing facilities to the transfer unit, wherein the facilities comprises one or more of a power supply, a water supply and/or drain, a vacuum duct and an air supply.

17. Assembly according to claim 16, wherein the interface unit comprising an actuator for moving the interface unit or a coupling unit of the interface unit, towards the transfer unit to provide said connection, preferably wherein the actuator is arranged for moving the interface unit or said coupling unit is a substantially vertical direction.

18. Assembly according to claim 1, further comprising a pre-vacuum seal and a vacuum seal, which are both arranged around the access opening in the side wall of the enclosure at least when the door panel is arranged in front of the access opening of the enclosure.

19. Assembly according to claim 18, wherein the vacuum seal is arranged between the pre-vacuum seal and the access opening.

20. Assembly according to claim 18, wherein the pre-vacuum seal comprises a flexible flap which extends in a direction between the door panel and the enclosure over a distance which is larger than the thickness of the vacuum seal in this direction, at least when the door panel is arranged in front of the access opening of the enclosure.

21. Assembly according to claim 18, wherein the pre-vacuum seal is arranged in the side wall of the enclosure, preferably in a first recess in the side wall of the enclosure.

22. Assembly according to claim 18, wherein the vacuum seal is arranged in the side wall of the enclosure, preferably in a second recess in the side wall of the enclosure.

23. Assembly according to claim 1, wherein the transfer elements comprises one or more air pads which are connectable to a compressed air supply.

24. Assembly according to claim 23, wherein the one or more air pads are arranged at a bottom side of the transfer unit, and are preferably arranged for hovering the transfer unit substantially above a floor, in particular a substantially closed floor near the enclosure.

25. Assembly according to claim 23, wherein the one or more air pads are arranged at the bottom side of the transfer unit to provide a substantially balanced and/or stable hovering of the transfer unit above the floor.

26. Assembly according to claim 1, wherein the door panel is provided with a transit opening and wherein the assembly further comprises a transfer device which is arranged at a fixed and/or rigid position on said transfer unit, substantially adjacent to the transit opening.

27. Assembly according to claim 26, wherein the transfer device comprises a load lock system which is connected to the door panel via a flexible coupling, preferably via a vacuum bellow, which surrounds the transit opening.

28. Assembly according to claim 1, wherein the door panel is provided with one or more vacuum pumps, preferably one or more turbomolecular pumps.

29. Assembly according to claim 28, wherein the one or more vacuum pumps are connected to the transfer unit via a flexible conduit, preferably via a vacuum bellow.

30. Assembly according to claim 29, wherein the flexible conduit is connectable to an interface unit to provide a connection between the one or more vacuum pumps and a vacuum duct in the transfer unit, which vacuum duct preferably is connected to a pre-vacuum pump.

31. Transfer unit suitable and intended for use in an assembly according to claim 1.

32. Transfer unit for an assembly for enclosing a target processing machine, wherein the assembly comprises an enclosure, a door panel and a transfer unit,
 wherein the enclosure comprises an access opening in a side wall of the enclosure, and wherein the door panel is arranged for closing the access opening, and
 wherein the transfer unit comprising one or more transfer elements for moving the transfer unit with respect to the enclosure, in particular for positioning the transfer unit adjacent to the enclosure and/or the door panel, wherein the transfer elements comprises one or more air pads which are connectable to a compressed air supply.

33. Transfer unit according to claim 32, wherein the one or more air pads are arranged at a bottom side of the transfer unit, and are preferably arranged for hovering the transfer unit substantially above a floor, in particular a substantially closed floor near the enclosure.

34. Transfer unit according to claim 33, wherein the one or more air pads are arranged at the bottom side of the transfer unit to provide a substantially balanced and/or stable hovering of the transfer unit above the floor.

35. Assembly for enclosing a target processing machine, wherein the assembly comprises an enclosure, a door, a transfer unit, and a floor section for at least supporting said transfer unit,
 wherein the enclosure comprises an access opening in a side wall of the enclosure, and wherein the door panel which is arranged for closing the access opening,
 wherein the transfer unit comprising one or more transfer elements for moving the transfer unit with respect to the enclosure, wherein the door panel is mounted to the transfer unit by means of an flexible coupling, wherein the flexible coupling is arranged to allow a movement of the door panel with respect to the transfer unit at least in a direction towards and/or away from the enclosure at least when the transfer unit is arranged in front of the access opening of the enclosure, wherein the transfer unit with the door panel is arranged to be detachable from the enclosure, and
 wherein the floor section is arranged adjacent to the enclosure and/or the door panel, and is provided with a transfer unit location for positioning the transfer unit thereon.

36. Assembly according to claim 35, wherein the enclosure is arranged at a fixed and/or rigid position on said floor section.

37. Assembly according to claim 35, wherein the transfer unit comprises support members and the transfer unit location of the floor section comprises support member contact surfaces, wherein each of said support member contact surfaces is arranged to receive one of the support members, wherein the support members and support member contact surfaces are arranged to provide a fixed distance between the transfer unit and the floor section and/or to provide a fixed rotational orientation around an axis which extends substantially parallel to the floor section.

38. Assembly according to claim 35, wherein the floor section is provided with an interface unit arranged at the transfer unit location, wherein the interface unit is connectable to the transfer unit at least when the transfer unit is arranged substantially at the transfer unit location on the floor section.

39. Assembly according to claim 38, wherein the interface unit is arranged to provide a connection between the transfer unit and technical service connections for providing facilities to the transfer unit, wherein the facilities comprises one or more of a power supply, a water supply and/or drain, a vacuum duct and an air supply.

40. Assembly according to claim 39, wherein the interface unit comprising an actuator for moving the interface unit or a coupling unit of the interface unit towards the transfer unit to provide said connection, preferably wherein the actuator is arranged for moving the interface unit or said coupling unit is a substantially vertical direction.

41. Assembly according to claim 35, wherein the floor section comprises a pedestal, in particular a substantially rigid and/or monolithic pedestal for carrying said transfer unit.

42. Assembly according to claim 41, wherein the pedestal is arranged for carrying the enclosure, preferably in a substantially rigid and/or fixed position with respect to the pedestal.

* * * * *